United States Patent
Hsieh

(10) Patent No.: US 8,334,665 B2
(45) Date of Patent: Dec. 18, 2012

(54) FAN CONTROL SYSTEM

(75) Inventor: Ming-Chih Hsieh, Tu-Cheng (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 204 days.

(21) Appl. No.: 12/953,256

(22) Filed: Nov. 23, 2010

(65) Prior Publication Data

US 2012/0092061 A1    Apr. 19, 2012

(30) Foreign Application Priority Data

Oct. 14, 2010   (TW) .................................. 99135041

(51) Int. Cl.
*H02P 6/00* (2006.01)

(52) U.S. Cl. ................ 318/400.01; 318/400.06; 388/800

(58) Field of Classification Search ............. 318/400.01, 318/400.06, 432; 388/800, 804, 806, 811, 388/815, 821, 823, 910

See application file for complete search history.

(56) References Cited

U.S. PATENT DOCUMENTS

| 4,977,375 | A | * | 12/1990 | Toth ............................. 324/511 |
| 5,481,194 | A | * | 1/1996 | Schantz et al. ................ 324/522 |
| 5,721,474 | A | * | 2/1998 | Lee et al. ...................... 318/434 |
| 5,942,866 | A | * | 8/1999 | Hsieh ............................ 318/268 |
| 6,163,266 | A | * | 12/2000 | Fasullo et al. ................ 340/664 |
| 6,674,257 | B2 | * | 1/2004 | Xi ............................ 318/400.22 |
| 7,205,733 | B2 | * | 4/2007 | Xiong et al. ............. 318/400.11 |
| 7,619,535 | B2 | * | 11/2009 | Chen et al. .................... 340/635 |
| 7,701,158 | B2 | * | 4/2010 | Wu et al. ...................... 318/268 |

* cited by examiner

*Primary Examiner* — Rina Duda
(74) *Attorney, Agent, or Firm* — Altis Law Group, Inc.

(57) ABSTRACT

A fan control system for controlling a fan to dissipate heat from an electronic device includes a current detection circuit having a shunt resistor to receive current, a signal amplification circuit having an operational amplifier, and a switch circuit having an npn transistor and a pnp transistor. A first terminal of the shunt resistor is connected to the electronic device, a second terminal of the shunt resistor is connected to the electronic device via a power source and is grounded. A non-inverting terminal of the operational amplifier is connected to the first terminal of the shunt resistor, an inverting terminal of the operation amplifier is connected to the second terminal of the shunt resistor via a first resistor and connected to an output terminal of the operational amplifier via a second resistor. The output terminal of the operation amplifier is grounded via a third resistor and a sixth resistor.

6 Claims, 1 Drawing Sheet

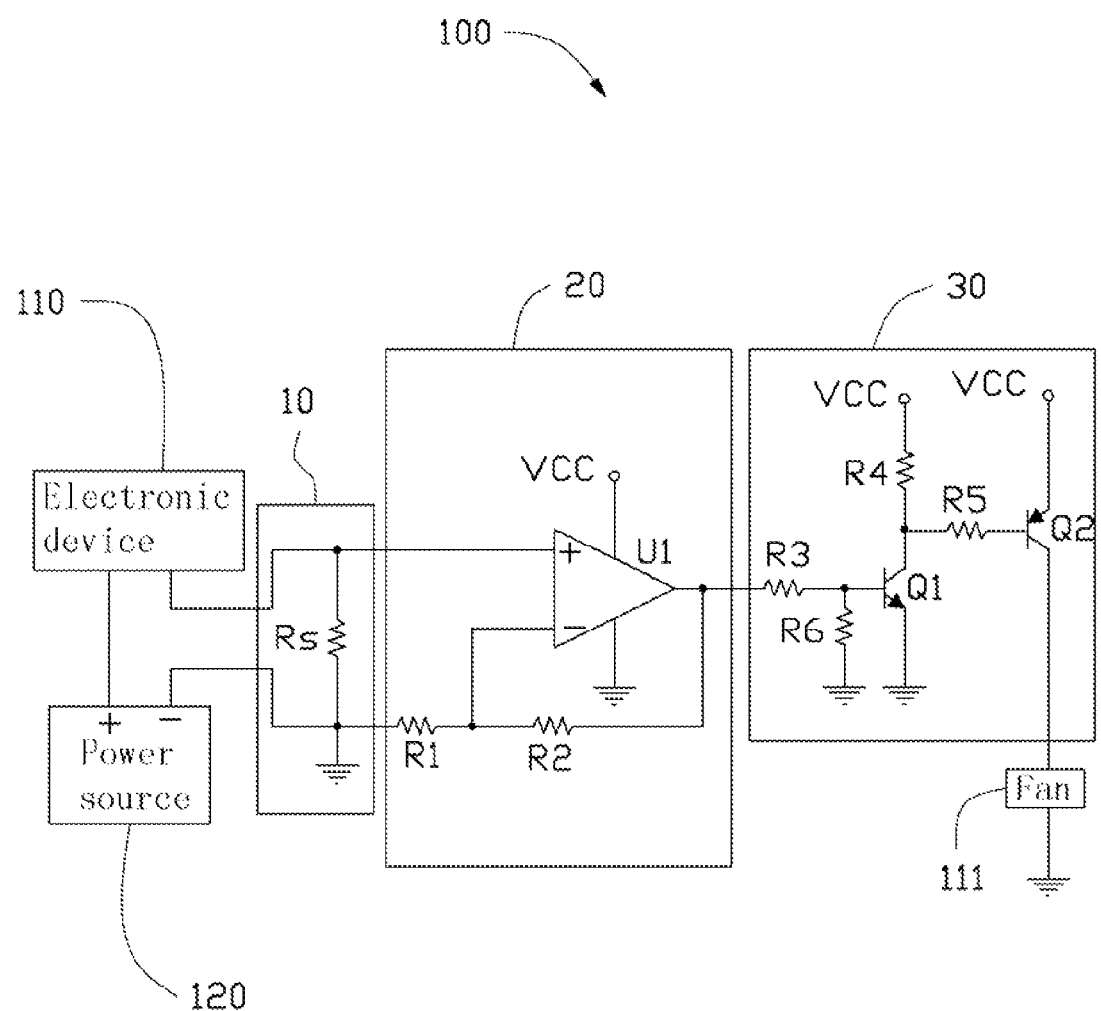

FAN CONTROL SYSTEM

BACKGROUND

1. Technical Field

The present disclosure relates to heat dissipation technology, and particularly, to fan control systems.

2. Description of Related Art

A heat dissipation device is used to cool an electronic device, such as a CPU of a personal computer. The heat dissipation device typically includes a fan, a temperature sensor, and a controller. Heat generated by the electronic device increases the environmental temperature. If the environmental temperature detected by the temperature sensor reaches a predetermined value, the controller will control the fan to rotate to dissipate unwanted heat away from the electronic device. However, the electronic device may overheat, while the environmental temperature does not reach the predetermined value, as a long time is needed to increase the environmental temperature. As a result, the fan may be turned on after the electronic device has already been overheated for a long time. If this happens, the heat in the electronic device is dissipated with delay and the life span of the electronic device is shortened.

Therefore, it is desirable to provide a fan control system, which can overcome or at least alleviate the above-mentioned problems.

BRIEF DESCRIPTION OF THE DRAWINGS

The FIGURE is a circuit diagram of a fan control system, according to an exemplary embodiment.

DETAILED DESCRIPTION

Referring to the FIGURE, a fan control system 100, according to an exemplary embodiment, includes a current detection circuit 10, a signal amplification circuit 20, and a switch circuit 30. The fan control system 100 is configured for controlling a fan 111 to dissipate heat from an electronic device 110. A power source 120 supplies power to the electronic device 110 and the fan control system 100.

The current detection circuit 10 includes a shunt resistor Rs. In one embodiment, the shunt resistor Rs can be a Manganin resistor. A first terminal of the shunt resistor Rs is connected to the electronic device 110, and a second terminal of the shunt resistor Rs is connected to a cathode of the power source 120 and is grounded. An anode of the power source 120 is connected to the electronic device 110.

The signal amplification circuit 20 includes an operational amplifier U1, a first resistor R1, and a second resistor R2. A non-inverting terminal of the operational amplifier U1 is connected to the first terminal of the shunt resistor Rs. An inverting terminal of the operational amplifier U1 is connected to the cathode of the power source 120 via the first resistor R1, and is connected to an output terminal of the operational amplifier U1 via the second resistor R2.

The switch circuit 30 includes an npn transistor Q1, a pnp transistor Q2, a third resistor R3, a fourth resistor R4, a fifth resistor R5, and a sixth resistor R6. The output terminal of the operational amplifier U1 is grounded via the third resistor R3 and the sixth resistor R6 (e.g., a resistive network/load). A base of the npn transistor Q1 is connected to a node between the third resistor R3 and the sixth resistor R6. An emitter of the npn transistor Q1 is grounded. A collector of the npn transistor Q1 is connected to a power supply Vcc via the fourth resistor R4, and connected to a base of the pnp transistor Q2 via the fifth resistor R5. An emitter of the pnp transistor Q2 is connected to the power supply Vcc. A collector of the pnp transistor Q2 is grounded via the fan 111.

A voltage V1 across the shunt resistor Rs satisfies the following equation: $V1=I\times Rs$, where I is the current through the shunt resistor Rs. A voltage V2 at the output terminal of the operational amplifier U1 satisfies the following equation: $V2=V1(1+R2/R1)=I\times Rs(1+R2/R1)$.

When the electronic device 110 is in operation, the current I through the shunt resistor Rs reaches $I_0$, and the voltage at the output terminal of the operational amplifier U1 reaches $V_0$, where $V_0=I_0\times Rs(1+R2/R1)$, causing the npn transistor Q1 and the pnp transistor Q2 to turn on. Therefore, the fan 111 is turned on to dissipate heat from the electronic device 110. The current $I_0$ and the voltage $V_0$ are predetermined by changing the shunt resistor Rs, the first resistor R1, and the second resistor R2. If the current I is less than the predetermined current $I_0$, the voltage V2 at the output terminal of the operational amplifier U1 will be less than $V_0$, and the npn transistor Q1 and the pnp transistor Q2 will be turned off. Therefore, the fan 111 cannot be started. As a result, the fan 111 is driven according to the current I through the shunt resistor Rs and the heat is dissipated away from the electronic device 110 without delay, thus increasing the life span of the electronic device 110.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A fan control system for controlling a fan to dissipate heat from an electronic device, comprising:
   a current detection circuit comprising a shunt resistor to receive current, a first terminal of the shunt resistor connected to the electronic device, a second terminal of the shunt resistor connected to the electronic device via a power source and being grounded;
   a signal amplification circuit comprising an operational amplifier, a first resistor, and a second resistor, wherein a non-inverting terminal of the operational amplifier is connected to the first terminal of the shunt resistor, and an inverting terminal of the operational amplifier is connected to the second terminal of the shunt resistor via the first resistor and connected to an output terminal of the operational amplifier via the second resistor; and
   a switch circuit comprising an npn transistor, a pnp transistor, a third resistor, a fourth resistor, a fifth resistor, and a sixth resistor, wherein the output terminal of the operational amplifier is grounded via the third resistor and the sixth resistor, a base of the npn transistor is connected to a node between the third resistor and the sixth resistor, an emitter of the npn transistor is grounded, a collector of the npn transistor is connected to a power supply via the fourth resistor and connected to a base of the pnp transistor via the fifth resistor, an emitter of the pnp transistor is connected to the power supply, and a collector of the pnp transistor is grounded via the fan.

2. The fan control system as claimed in claim 1, wherein the shunt resistor is a Manganin resistor.

3. A fan control system for controlling a fan to dissipate heat from an electronic device, comprising:
- a signal amplification circuit comprising an input and an output;
- a current detection circuit connected between the electronic device and the input of the signal amplification circuit; and
- a switch circuit connected to an output of the signal amplification circuit, the switch circuit comprising an npn transistor and a pnp transistor connected in parallel via a first resistor connected to a collector of the npn transistor and a base of the pnp transistor, wherein a base of the npn transistor is connected to the output of the signal amplification circuit via a resistive network, an emitter of the npn transistor is grounded, an emitter of the pnp transistor and a collector of the npn transistor are connected to a power supply, and a collector of the pnp transistor is grounded via the fan.

4. The fan control system of claim 3, wherein the current detection circuit comprises a shunt resistor.

5. The fan control system of claim 4, wherein the signal amplification circuit comprises a second resistor, a third resistor, and an operational amplifier configured to output a voltage to the switch circuit about equal to a voltage across the shunt resistor multiplied by (1+ratio of the third resistor over the second resistor).

6. The fan control system of claim 5, further comprising a fourth resistor connected between the collector of the npn transistor and the power supply.

* * * * *